United States Patent [19]

Statz et al.

[11] Patent Number: 5,745,587
[45] Date of Patent: Apr. 28, 1998

[54] HEARING AID AMPLIFIER CIRCUITRY

[75] Inventors: Timothy V. Statz, Minneapolis; Thomas A. Scheller, Fridley, both of Minn.

[73] Assignee: Bausch & Lomb Incorporated, Rochester, N.Y.

[21] Appl. No.: 475,230

[22] Filed: Jun. 7, 1995

[51] Int. Cl.$^6$ .............................. H03F 21/00; H04R 3/00
[52] U.S. Cl. .................. 381/120; 381/96; 330/263; 330/265; 330/267
[58] Field of Search ........................ 330/263, 267, 330/265; 381/96, 120, 59, 68.4

[56] References Cited

U.S. PATENT DOCUMENTS

| | | | |
|---|---|---|---|
| 3,303,380 | 2/1967 | Kozikowski | 330/265 |
| 3,700,921 | 10/1972 | Gay | 307/235 |
| 3,895,238 | 7/1975 | Saari | 307/255 |
| 3,912,981 | 10/1975 | Tsurushima | 317/33 |
| 3,968,382 | 7/1976 | Tsurushima | 307/202 |
| 3,979,606 | 9/1976 | Ahmed | 307/235 |
| 3,984,781 | 10/1976 | Shizuhara | 330/35 |
| 3,995,114 | 11/1976 | Marschinke | 179/1 |
| 4,031,482 | 6/1977 | Tsurushima | 330/35 |
| 4,114,109 | 9/1978 | Campioni | 330/267 |
| 4,132,907 | 1/1979 | David | 307/255 |
| 4,167,708 | 9/1979 | Goto | 330/263 |
| 4,180,782 | 12/1979 | Kaplan | 330/276 |
| 4,228,371 | 10/1980 | Mazgy | 307/317 |
| 4,254,380 | 3/1981 | Guillien | 330/275 |
| 4,259,599 | 3/1981 | Takada | 307/255 |
| 4,394,625 | 7/1983 | Sakai | 330/267 |
| 4,404,528 | 9/1983 | Yamaguchi | 330/288 |
| 4,424,493 | 1/1984 | Schroeder | 330/263 |
| 4,454,479 | 6/1984 | Spires | 330/263 |
| 4,463,318 | 7/1984 | Kaplan | 330/251 |
| 4,543,453 | 9/1985 | Brander | 179/107 |
| 4,544,895 | 10/1985 | Stoker | 330/273 |
| 4,549,095 | 10/1985 | Stefani et al. | 307/254 |
| 4,592,087 | 5/1986 | Killion | 381/68 |
| 4,607,232 | 8/1986 | Gill, Jr. | 330/267 |
| 4,689,818 | 8/1987 | Ammitzboll | 381/68 |
| 4,689,819 | 8/1987 | Killion | 381/68 |
| 4,701,631 | 10/1987 | Chieli | 307/254 |
| 5,014,016 | 5/1991 | Anderson | 330/10 |
| 5,070,308 | 12/1991 | Padi | 330/268 |
| 5,111,506 | 5/1992 | Charpentier et al. | 381/68.4 |
| 5,146,107 | 9/1992 | Matsuoka et al. | 307/253 |
| 5,332,928 | 7/1994 | Johnson | 307/296.6 |
| 5,399,988 | 3/1995 | Knierim | 330/149 |
| 5,521,553 | 5/1996 | Butler | 330/265 |

Primary Examiner—Forester W. Isen
Attorney, Agent, or Firm—Craig E. Larson

[57] ABSTRACT

An electroacoustic device such as a hearing aid having a battery, microphone, speaker, a preamplifier, a voltage regulator and power amplifier. The power amplifier includes identically configured output and bridge stages connected to opposite sides of the speaker, the output signals from the output stage being connected through a blocking capacitor to the input of the bridge stage. The output/bridge stage circuit includes an interface stage and two current gain stages. The interface stage converts voltage signals to current signals with a pair of outputs respectively connected to the two like-configured current gain stages. Each current gain stage includes two successive sections, each having a pair of transistors, one of which is configured as a diode connected in series with a resistor to shunt current from the base of the other transistor. The current output of the current gain stages is thus responsive to the input current level, permitting low quiescent current with efficient delivery of current to the receiver, and providing high peak currents with minimum distortion. Also, quiescent current is essentially insensitive to variations in battery voltage and temperature.

26 Claims, 2 Drawing Sheets

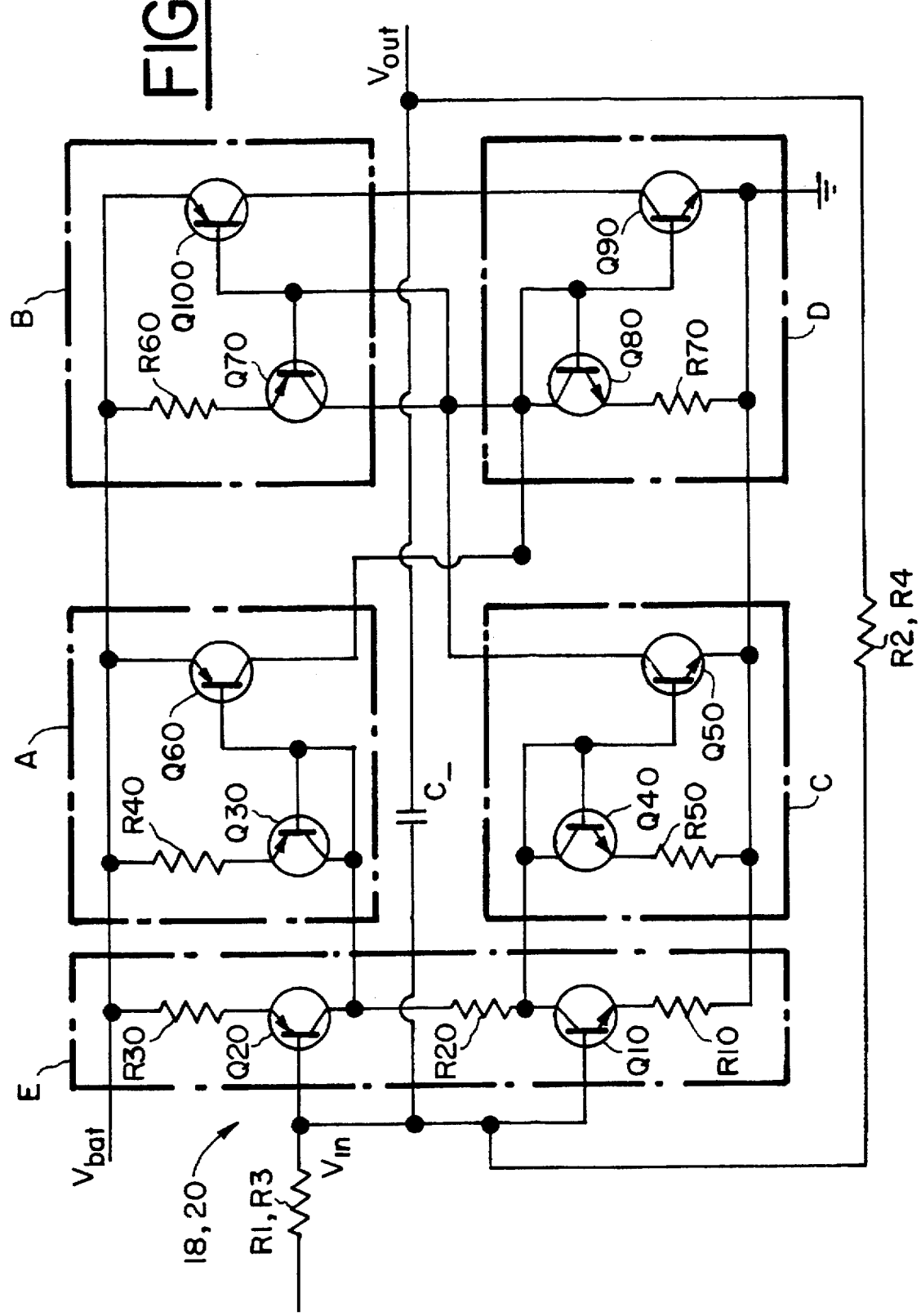

HEARING AID AMPLIFIER CIRCUITRY

This invention generally relates to electronic devices effecting current gain, especially devices operable under low voltage. The invention, in preferred aspects, more particularly relates to power amplifiers. The invention is still more particularly concerned with miniaturized sound amplification circuits such as those used in hearing aids, voice pagers, headsets, and similar devices.

Amplifier systems consist of components such as preamplifiers, gain stages, intermediate amplifiers, power amplifiers (or output amplifiers), and voltage regulators. The design of power amplifiers for low voltage battery-operated systems (e.g., less than about 1.5 volts) is particularly challenging. The device must consume minimal quiescent current to minimize battery drain in low signal conditions. However, the device must also have a large current drive capability for high signal conditions.

The demands on the designer of power amplifiers for low-voltage, battery-driven devices such as hearing aids is further compounded by the relatively small space available for the various components of the device. Amplifier components must be minimized in both size and number to conserve space.

The first hearing aids employed Class A amplifiers. These amplifiers had the disadvantage of requiring large quiescent current to achieve low distortion. Class B amplifiers were created to overcome the drawbacks of Class A amplifiers. Class B amplifiers have no quiescent current in the final output stage. However, this results in distortion—a dead zone occurs as the signal crosses zero.

U.S. Pat. No. 3,995,114 (Marschinlke) discloses a Class AB hearing aid amplifier exhibiting low quiescent current and low distortion with a large current drive capability. However, while this is true at typical battery voltages and operating temperatures, the quiescent current is exponentially dependent on battery voltage. This in turn causes a marked deterioration of battery drain at high battery voltages and a marked increase in distortion at low battery voltages. Battery voltage typically drops from 1.4 to 1.0 volts over the useful life of the battery. Additionally, temperature can effect the quiescent current, causing the same effects on battery drain and distortion.

One approach to overcoming the problems of voltage and temperature variation is the use of Class D amplifiers which use pulse width modulation to drive a speaker. A disadvantage of Class D amplifiers is that they require an internal clock which can cause undesirable aliasing and beat frequencies. In order to maintain low distortion when driving low impedance loads, Class D amplifiers require a large capacitor across the battery supply. This leads to another disadvantage: when the amplifier is turned off—the charge on the capacitor allows the internal clock to slow down and run through the audible range, causing undesirable sounds.

SUMMARY OF THE INVENTION

In one aspect, this invention is a refinement of a Class AB power amplifier that operates independent of battery temperature and voltage (especially at voltages between about 1.0 and about 1.5 volts). A desirable feature of the power amplifier is a high capability for current gain while minimizing quiescent current. The power amplifier achieves this by splitting a voltage signal in an interface stage into high-going and low-going current subsignals in parallel signal paths. Each signal path contains two current gain stages of opposite polarity producing the same current gain at the output for the two separate paths. The current gain stages are unique, comprising a transistor, a diode-configured device, and a resistor connected in series with said diode-configured device shunting current from the base of the device. The current gain stages have low current gain at low current levels and high current gain at high current levels. In integrated circuit processes, the opposite polarity devices have independently variable current gain, so that placing one of each polarity in each parallel signal path results in equal total current gain for the two paths. The interface stage is a modified inverter which uses resistors to modulate the exponential dependence of current on voltage in transistors. Shunt-shunt feedback is used to control voltage gain and distortion, keeping them relatively independent of integrated circuit process variations.

In another aspect, this invention is a power gain configuration that uses two identical power amplifiers, one of which amplifies the original signal and whose output is applied to one end of the speaker and to the input of the other power amplifier. The other power amplifier is configured as a unity-gain inverter and whose output is connected to the other end of the speaker. This configuration doubles the potential output voltage at a given battery voltage, allowing an output power increase of a factor of four.

In addition to the advantages alluded to above, the power amplifier of this invention eliminates the need for a clock and further eliminates the need for a large capacitor across the battery. The attributes of this invention are desirable in any low-voltage application requiring current gain. It is particularly useful in small, battery-operated devices such as hearing aids, and pagers. Other applications will be apparent to those of ordinary skill in the art.

The foregoing and other features of the invention will be more readily understood and fully appreciated from the following detailed description, taken in conjunction with the accompanying drawings.

BRIEF DESCRIPTION OF THE DRAWINGS

FIG. 2 is a schematic of the power amplifier of this invention.

DETAILED DESCRIPTION OF THE INVENTION

Figure 1:
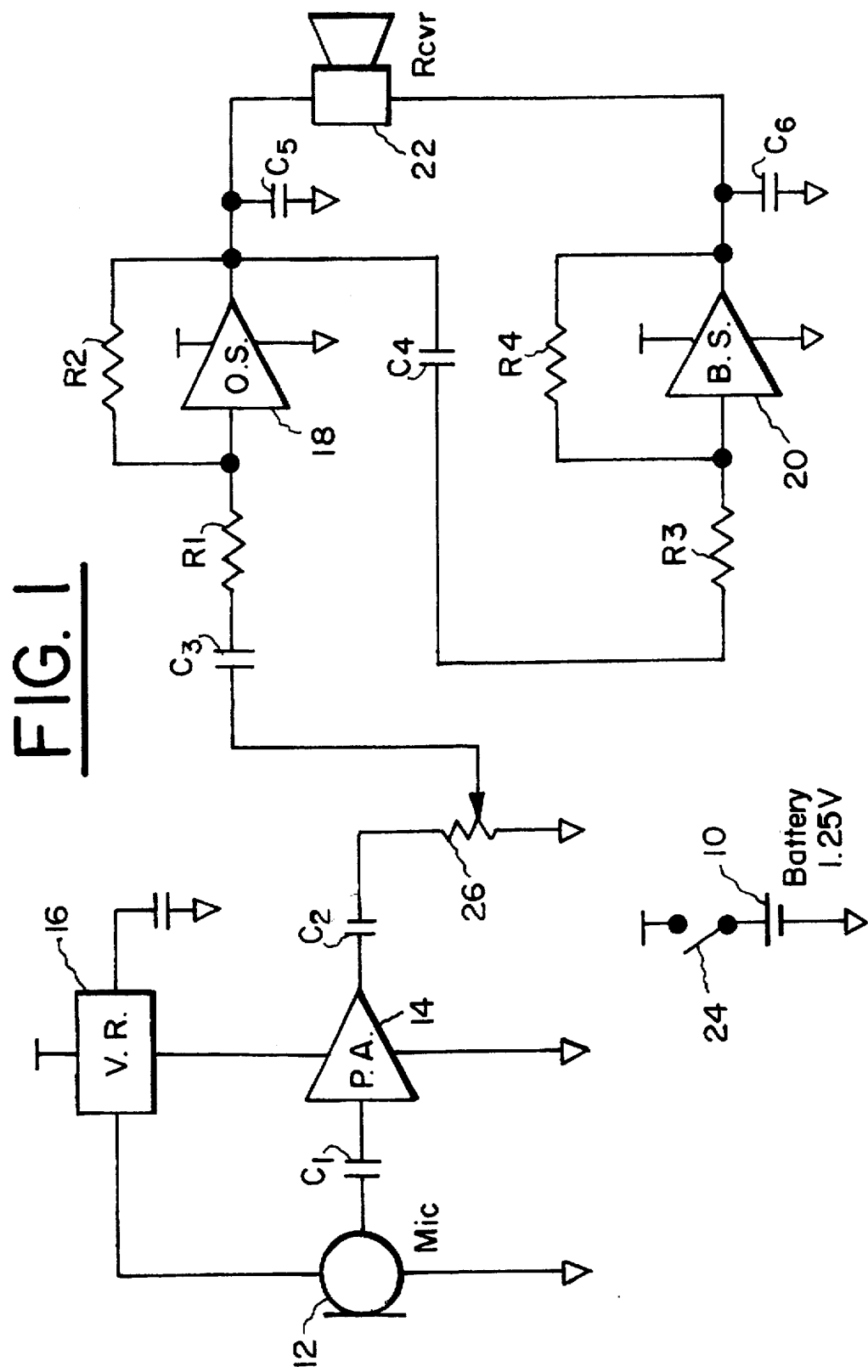
FIG. 1 is an electrical schematic showing two power amplifiers of this invention in a power gain configuration, as incorporated in a device such as a hearing aid.

The invention will be explained in the context of a hearing aid device, although it will be understood that the inventive subject matter may be employed in applications such as telephone pagers and other similar devices. Referring to FIG. 1 of the drawings, basic components of the device include battery 10, microphone 12, preamplifier 14, voltage regulator 16, output stage 18, bridge stage 20, and receiver or speaker 22. The positive terminal of battery 10, assumed for purposes of the present discussion to have an initial power of 1.4 volts, is connected, through selectively controlled on/off switch 24, to voltage regulator 16, output stage 18, and bridge stage 20. Microphone 12, which picks up the sounds to be amplified and converts them to electrical waveforms, is connected to the negative side of battery 10, and the microphone output is connected, through capacitor C1, to preamplifier 14. Preamplifier 14 is designed for low noise, low-current, and high input impedance. Voltage regulator 16 provides ripple-free voltage at a predetermined level to microphone 12 and preamplifier 14. Details of internal circuitry of preamplifier 14 and voltage regulator 16 may, for purposes of the present invention, be conventional in all respects and therefore are not shown.

The output of preamplifier 14 is connected, through capacitor C2, to a variable resistor providing a selectively adjustable volume control 26. The wiper of volume control 26 is connected, through capacitor C3 and resistor R1, to the input side of output stage 18. Feedback to output stage 18 is provided through resistor R2. The output side of output stage 18 is connected to one side of speaker 22, through capacitor C4 and resistor R3 to the input side of bridge stage 20, and through capacitor C5 to signal ground. The output side of bridge storage 20 is connected to the other side of speaker 22, and to signal ground through capacitor C6. Feedback to bridge stage 20 is provided through resistor R4. The ratio of resistors R2 and R1 is preferably double the ratios of resistors R4 and R3, i.e., R2/R1 may be 2:1 and R4/R3 may be 1:1.

Turning now to FIG. 2, the preferred embodiment of the circuit forming the power amplifier is shown. This circuit is employed, in identical form, in both output stage 18 and bridge stage 20. The identical circuits forming the output and bridge stages, and the manner of their cooperative employment, operate in a novel and improved manner, providing a number of highly desirable features in an electroacoustic device. As will be explained, the unique power amplifier provides current gain which increases with current level, allowing both low quiescent current and high current drive capability. It also provides high peak currents with minimum distortion, and performance and quiescent current are essentially independent of variations in expected ranges of battery voltage and temperature.

For convenience of explanation, dash-dot boxes have been placed around portions of the circuit. Boxes A, B, C, and D surround current gain devices, each of which has two transistors, one of which is configured as a diode, and a resistor. The input is connected to the base of both transistors and to the collector of the diode-configured transistor, the emitter of which is connected in series with the resistor.

For example, referring to box D, resistor R70 shunts current away from the base of transistor Q90 to control current gain of this configuration. At very low current flow, resistor R70 is of very little effect and gain is essentially the ratio of the areas of transistors Q80 and Q90, i.e., (area Q90)/(area Q80). As current increases, the voltage drop across resistor R70 increases, thereby reducing the base-emitter drop of transistor Q80, lowering the "base" current and increasing the current gain. Thus, at high currents, the circuit gain approaches the gain of transistor Q90. In effect, the circuit senses the current needs and adjusts its gain accordingly. This current-dependent gain provides the aforementioned, desirable combination of low quiescent current and high current drive capability.

The box labeled E encloses the circuit elements providing interface of the input with the amplification stages. This circuit converts voltage input to a low quiescent current. It provides dual inputs, tied to the collectors of transistors Q10 and Q20, respectively, to the circuit portions of boxes A and C. At quiescence, the feedback resistor (R2, R4, FIG. 1) forces the input to approximately mid-rail. Resistors R10 and R30 are equal, and the base-emitter drops of transistors Q10 and Q20 are approximately equal. Therefore, both transistors draw about the same current, making the output current very small. As the input deviates from mid-rail, the currents are imbalanced and the difference is injected into the next stage (boxes A and C).

It will be noted that the two transistors of each of current gain devices A, B, C and D are of like polarity. The transistors of one of the current gain devices which receives an input from interface E (i.e., box A) are of opposite polarity from the transistors of the other of the current gain devices which is connected to interface E (i.e., box C). The transistors of these boxes (A and C) are of opposite polarity from the transistors of the respective current gain devices to which they are connected (i.e., boxes D and B, respectively). In this arrangement, low-going signals will be amplified by stages A and D, while high-going signals will be amplified by stages C and B; if signals are not separated into high- or low-going, amplification will be by A or C and B or D. It should also be noted that, although the devices within each of the interface and the current gain stages are described as transistors, any device which is operable to effect a current gain function may be employed including, for example, diodes, MOS or EMOS devices, field effect transistors, cathode ray tubes, etc.

Transistor areas are chosen to provide a low current gain under low-current conditions. The current gain under high-current conditions is limited only by the gains of the individual transistors. The ratio of feedback to input resistance is chosen high enough to assure that clipping occurs first in the output stage and small enough to ensure that distortion is low. Capacitor C7 provides high frequency roll-off and adequate gain and phase margins.

Bridge stage 20 functions as an inverter to allow differential voltage swings of up to 2 volts. Capacitor C7 in the bridge stage does not get Miller multiplied, but combines with resistor R3 to form a low-pass filter corner at 10 KHz. Since any output offset voltage mismatch causes a DC current in the receiver, matching of the output and bridge stages is important.

What is claimed is:

1. A power amplifier comprising:
    a. an interface stage having a first pair of current gain devices, each having a base connected to receive incoming voltage signals, and respective first and second outputs for current signals to which said voltage signals are converted by said interface stage;
    b. a first current gain stage having a first input connected to receive said current signals from said first output, a third output connected to a load, and a first variable gain means connected between said first input and said third output for increasing current gain in response to increases in said current signals; and
    c. a second current gain stage having a second input connected to receive said current signals from said second output, a fourth output connected to said load, and second variable gain means connected between said second input and said fourth output for increasing current gain in response to increases in said current signals.

2. The power amplifier of claim 1 wherein said first and second gain stages include second and third pairs of current gain devices, respectively, one of the devices of each of said second and third pairs being configured as a diode connected in series with a resistor for shunting current from the other of said devices.

3. The power amplifier of claim 2 wherein said first pair of current gain devices are transistors of opposite polarities having emitters connected to said battery and to signal ground, respectively.

4. The power amplifier of claim 3 wherein the collectors of said first pair of transistors are connected to one another through a resistor and to said first and second outputs, respectively.

5. The power amplifier of claim 2 wherein said first and second gain stages include fourth and fifth pairs of current gain devices, respectively.

6. In a sound amplification device comprising a battery, a means for receiving audible sounds and converting them to voltage signals, a power amplifier, and a speaker for receiving amplified voltage signals and converting them to audible sounds; the improvement which comprises using a power amplifier comprising:

a. an interface stage having a first pair of current gain devices, each having a base connected to receive incoming voltage signals, and respective first and second outputs for current signals to which said voltage signals are converted by said interface stage;

b. a first current gain stage having a first input connected to receive said current signals from said first output, a third output connected to the speaker, and a first variable gain means connected between said first input and said third output for increasing current gain in response to increases in said current signals; and c. a second current gain stage having a second input connected to receive said current signals from said second output, a fourth output connected to the speaker, and second variable gain means connected between said second input and said fourth output for increasing current gain in response to increases in said current signals.

7. The sound amplification device of claim 6 wherein said first and second gain stages include second and third pairs of current gain devices, respectively, one of the devices of each of said second and third pairs being configured as a diode connected in series with a resistor for shunting current from the other of said devices.

8. The sound amplification device of claim 7 wherein said first pair of current gain devices are transistors of opposite polarities having emitters connected to said battery and to signal ground, respectively.

9. The sound amplification device of claim 8 wherein the collectors of said first pair of transistors are connected to one another and to said first and second outputs, respectively.

10. The sound amplification device of claim 7 wherein said first and second gain stages include fourth and fifth pairs of current gain devices, respectively.

11. A power gain configuration comprising two essentially identically configured power amplifiers having respective outputs connected across a load, the first power amplifier having an input connected to receive incoming voltage signals and the second power amplifier having an input connected to the output of the first power amplifier, each of the power amplifiers including means for effecting gain of current signals which increases in response to increases in the level of the current signals.

12. The power gain configuration of claim 11 further comprising a blocking capacitor between the output of the first power amplifier and the input of the second power amplifier.

13. The power gain configuration of claim 12 further comprising a first feedback line connected between the output and input of the first power amplifier and a second feedback line connected between the output and input of the second power amplifier.

14. The power gain configuration of claim 11 wherein the load is a speaker.

15. The power gain configuration of claim 11 wherein the current gain means comprise a pair of transistors, one configured as a diode connected in series with a resistor for shunting current from the base of the other of said transistors.

16. The power gain configuration of claim 11 wherein each of the power amplifiers includes an interface portion for converting the voltage signals to current signals which are supplied to the current gain means.

17. The power gain configuration of claim 16 wherein each of the power amplifiers includes a plurality of said current gain means.

18. In a sound amplification device comprising a battery, a means for receiving audible sounds and converting them to voltage signals, a power gain configuration, and a speaker for receiving amplified voltage signals and converting them to audible sounds; the improvement which comprises using a power gain configuration comprising two essentially identically configured power amplifiers having respective outputs connected across the speaker, the first power amplifier having an input connected to receive incoming voltage signals and the second power amplifier having an input connected to the output of the first power amplifier, each of the power amplifiers including means for effecting gain of current signals which increases in response to increases in the level of the current signals.

19. The sound amplification device of claim 18 further comprising a blocking capacitor between the output of the first power amplifier and the input of the second power amplifier.

20. The sound amplification device of claim 19 further comprising a first feedback line connected between the output and input of the first power amplifier and a second feedback line connected between the output and input of the second power amplifier.

21. The sound amplification device of claim 20 further comprising first and second resistances in said first and second feedback lines, respectively, and third and fourth resistances in the inputs of the first and second power amplifiers, respectively, the ratio of said first and third resistances being substantially double the ratio of the second and fourth resistances.

22. The sound amplification device of claim 18 wherein the current gain means comprise a pair of transistors, one configured as a diode connected in series with a resistor for shunting current from the base of the other of said transistors.

23. The sound amplification device of claim 22 wherein each of the power amplifiers includes an interface portion for converting the voltage signals to current signals which are supplied to the current gain means.

24. The sound amplification device of claim 18 wherein each of the power amplifiers includes a plurality of said current gain means.

25. The power gain configuration of claim 13 further comprising first and second resistances in said first and second feedback lines, respectively, and third and fourth resistances in the inputs of the first and second power amplifiers, respectively.

26. The power gain configuration of claim 25 wherein the ratio of the first and third resistances is substantially double the ratio of the second and fourth resistances.

* * * * *